US011195980B2

(12) United States Patent
Kikuchi et al.

(10) Patent No.: US 11,195,980 B2
(45) Date of Patent: Dec. 7, 2021

(54) TRANSPARENT SEALING MEMBER AND OPTICAL COMPONENT

(71) Applicant: NGK Insulators, Ltd., Nagoya (JP)

(72) Inventors: Yoshio Kikuchi, Nagoya (JP); Hiroyuki Shibata, Okazaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/795,878

(22) Filed: Feb. 20, 2020

(65) Prior Publication Data

US 2020/0194638 A1 Jun. 18, 2020

Related U.S. Application Data

(63) Continuation of application No. PCT/JP2018/030698, filed on Aug. 20, 2018.

(30) Foreign Application Priority Data

Aug. 23, 2017 (WO) .................. PCT/JP2017/030082

(51) Int. Cl.
*H01L 33/56* (2010.01)
(52) U.S. Cl.
CPC .................................... *H01L 33/56* (2013.01)
(58) Field of Classification Search
CPC .......... H01L 33/56; H01L 33/54; H01L 33/52
See application file for complete search history.

(56) References Cited

U.S. PATENT DOCUMENTS

| | | | |
|---|---|---|---|
| 2002/0006555 A1* | 1/2002 | Hasegawa | G03F 1/56 430/5 |
| 2003/0098651 A1 | 5/2003 | Lin et al. | |
| 2007/0267645 A1 | 11/2007 | Nakata et al. | |
| 2008/0166506 A1 | 7/2008 | Shin et al. | |
| 2010/0135034 A1 | 6/2010 | Oyaizu et al. | |
| 2014/0183591 A1* | 7/2014 | Jow | H01L 27/14618 257/99 |
| 2015/0103351 A1 | 4/2015 | Hess et al. | |
| 2017/0114253 A1* | 4/2017 | Nakayama | C09J 11/04 |

(Continued)

FOREIGN PATENT DOCUMENTS

| | | | |
|---|---|---|---|
| JP | 2001-237335 A1 | 8/2001 | |
| JP | 2002-167691 A1 | 6/2002 | |
| JP | 2005-317793 A1 | 11/2005 | |

(Continued)

OTHER PUBLICATIONS

International Search Report and Written Opinion (Application No. PCT/JP2018/030698) dated Sep. 11, 2018.

(Continued)

*Primary Examiner* — Jay C Chang
*Assistant Examiner* — Mikka Liu
(74) *Attorney, Agent, or Firm* — Burr & Brown, PLLC

(57) ABSTRACT

The present invention relates to a transparent sealing member and an optical component. This transparent sealing member (10) is used in a package (20) for accommodating at least one optical element (14), and is bonded to a mounting substrate (16) having the optical element (14) mounted thereto, by a resin adhesive (50). The transparent sealing member (10) is provided with a plurality of particles (32) which are affixed to a surface (30*a*) to be bonded to the mounting substrate (16).

16 Claims, 8 Drawing Sheets

(56) References Cited

U.S. PATENT DOCUMENTS

2017/0162767 A1* 6/2017 Lu .......................... H01L 33/58

FOREIGN PATENT DOCUMENTS

| | | |
|---|---|---|
| JP | 2007-311707 A1 | 11/2007 |
| JP | 2008-174745 A1 | 7/2008 |
| JP | 2010-153803 A1 | 7/2010 |
| JP | 2011-040577 A1 | 2/2011 |
| JP | 2012-069977 A1 | 4/2012 |
| JP | 2014-063995 A1 | 4/2014 |
| JP | 2015-516568 A1 | 6/2015 |
| JP | 2015-230983 A1 | 12/2015 |
| JP | 2017-011200 A1 | 1/2017 |
| JP | 2017-147406 A1 | 8/2017 |
| WO | 2016/010043 A1 | 1/2016 |

OTHER PUBLICATIONS

English Translation of the International Preliminary Report on Patentability (Chapter I)(Application No. PCT/JP2018/030698) dated Mar. 5, 2020.

* cited by examiner

FIG. 8  [Table 1]

| | Particles | Joining Method | Average Particle Diameter ($\mu$m) | Surface Roughness Ra ($\mu$m) | Rejection Rate (%) |
|---|---|---|---|---|---|
| Exemplary Embodiment 1 | Ceramic(SiC) | Resin Adhesive | 0.1 | 0.1 | 3 |
| Exemplary Embodiment 2 | Ceramic(SiC) | Resin Adhesive | 1.0 | 0.5 | 2 |
| Exemplary Embodiment 3 | Ceramic(SiC) | Resin Adhesive | 5.0 | 2.5 | 1 |
| Exemplary Embodiment 4 | Ceramic(SiC) | Resin Adhesive | 10.0 | 5.0 | 5 |
| Exemplary Embodiment 5 | Metal(Mo) | Resin Adhesive | 0.1 | 0.1 | 2 |
| Exemplary Embodiment 6 | Metal(Mo) | Resin Adhesive | 1.0 | 0.5 | 1 |
| Exemplary Embodiment 7 | Metal(Mo) | Resin Adhesive | 5.0 | 2.5 | 0 |
| Exemplary Embodiment 8 | Metal(Mo) | Resin Adhesive | 10.0 | 5.0 | 4 |
| Exemplary Embodiment 9 | Intermetallic Compound Particles($MoSi_2$) | Resin Adhesive | 0.1 | 0.1 | 2 |
| Exemplary Embodiment 10 | Intermetallic Compound Particles($MoSi_2$) | Resin Adhesive | 1.0 | 0.5 | 1 |
| Exemplary Embodiment 11 | Intermetallic Compound Particles($MoSi_2$) | Resin Adhesive | 5.0 | 2.5 | 0 |
| Exemplary Embodiment 12 | Intermetallic Compound Particles($MoSi_2$) | Resin Adhesive | 10.0 | 5.0 | 4 |
| Exemplary Embodiment 13 | Ceramic(SiC) | Resin Adhesive | 0.1 | 0.1 | 3 |
| Exemplary Embodiment 14 | Ceramic(SiC) | Resin Adhesive | 0.05 | 0.05 | 21 |
| Exemplary Embodiment 15 | Ceramic(SiC) | Resin Adhesive | 15.0 | 9.0 | 25 |
| Comparative Example | – | Resin Adhesive | – | 0.02 | 35 |

TRANSPARENT SEALING MEMBER AND OPTICAL COMPONENT

CROSS-REFERENCE TO RELATED APPLICATIONS

This application is a Continuation of International Application No. PCT/JP2018/030698 filed on Aug. 20, 2018, which is based upon and claims the benefit of priority from International Application No. PCT/JP2017/030082 filed on Aug. 23, 2017, the contents all of which are incorporated herein by reference.

TECHNICAL FIELD

The present invention relates to a transparent sealing member which is a constituent member of an optical component that is used for, for example, an LED (light emitting diode), an LD (semiconductor laser) or the like, as well as to an optical component having such a transparent sealing member.

BACKGROUND ART

Generally, with an optical component having an optical element (for example, an LED, an LD, or the like) that emits ultraviolet radiation, a transparent sealing member is required in order to protect the optical element from the open air and moisture. Metallization or a resin adhesive is used in order to join a mounting substrate on which the optical element is mounted and a transparent sealing member to each other.

In Japanese Laid-Open Patent Publication No. 2001-237335, a casing is disclosed, which is constituted by a metal radiator plate on which a semiconductor element is mounted, a metal frame joined to an upper surface of the radiator plate by a brazing material such as silver solder or the like, and a ceramic lid joined by the brazing material to an upper surface of the frame.

In Japanese Laid-Open Patent Publication No. 2007-311707, a package for an ultraviolet radiation emitting device is disclosed in which a condenser lens constituted by a glass such as quartz or the like is bonded by an adhesive to a lens retaining member.

SUMMARY OF INVENTION

Incidentally, in the case that a resin adhesive such as epoxy or the like is used to join a mounting substrate and a transparent sealing member to each other, in certain cases, the resin adhesive deteriorates under the influence of ultraviolet radiation emitted from the optical element, and a favorable sealing property cannot be obtained.

The present invention has been devised taking into consideration the aforementioned problems, and has the object of providing a transparent sealing member in which adverse effects on the resin adhesive due to the ultraviolet radiation emitted from the optical element can be suppressed, and in which it is possible to suppress a deterioration in the sealing properties with a mounting substrate.

Further, another object of the present invention is to provide an optical component in which it is possible to suppress the influence of ultraviolet radiation on a resin adhesive that bonds a transparent sealing member and a mounting substrate to each other, and which is capable of extending the life of a usage period thereof.

[1] A transparent sealing member according to a first aspect of the present invention is a transparent sealing member adapted to be used in a package in which at least one optical element is accommodated, the transparent sealing member being bonded, by a resin adhesive, onto a mounting substrate on which the optical element is mounted. In addition, the transparent sealing member includes a plurality of particles fixed to a bonding surface thereof that is bonded to the mounting substrate.

More specifically, ultraviolet light that is emitted from the optical element is transmitted through the transparent sealing member and is emitted to the exterior. However, a portion of the ultraviolet light is guided inside the transparent sealing member and travels toward a joined portion of the transparent sealing member. Conventionally, the ultraviolet radiation that is guided through the transparent sealing member impinges upon the resin adhesive, and as a result, the resin adhesive may become deteriorated, as well as lead to a deterioration in the durability of the package (deterioration of the optical component).

In contrast thereto, the transparent sealing member according to the present invention includes the plurality of particles fixed to the bonding surface that is bonded with the mounting substrate. Therefore, due to the fact that the ultraviolet radiation that has been guided inside the transparent sealing member is attenuated and reflected by the particles, the ultraviolet radiation is not directly incident on the resin adhesive. More specifically, in the optical component, it is possible to suppress the influence of the ultraviolet radiation on the resin adhesive that bonds the transparent sealing member and the mounting substrate to each other, and the life of the usage period thereof can be extended.

[2] In the first aspect of the present invention, the plurality of particles are embedded and fixed in the transparent sealing member, or alternatively, are fixed via a reaction layer between the particles and the transparent sealing member.

[3] In the first aspect of the present invention, the transparent sealing member is used in an optical component having the optical element and the mounting substrate, and together with the mounting substrate, constitutes the package, which accommodates the optical element.

[4] In the first aspect of the present invention, the transparent sealing member is preferably made of quartz glass, optical glass, or sapphire.

[5] In the first aspect of the present invention, a melting point of the particles is preferably higher than a melting point of the transparent sealing member.

[6] In the first aspect of the present invention, the particles are preferably ceramic particles of nitride, carbide, or boride.

[7] In the first aspect of the present invention, a constituent material of the ceramic particles is preferably AlN (aluminum nitride), $Si_3N_4$ (silicon nitride), SiC (silicon carbide), WC (tungsten carbide), $Mo_2C$ (molybdenum carbide), BN (boron nitride), $B_4C$ (boron carbide), MoB (molybdenum boride), or WB (tungsten boride).

[8] In the first aspect of the present invention, the particles may be metal particles.

[9] In the first aspect of the present invention, a constituent material of the metal particles is preferably Mo (molybdenum), W (tungsten), Ti (titanium), Zr (zirconium), Pt (platinum), B (boron), Cr (chromium), or Ir (iridium).

[10] In the first aspect of the present invention, the particles may be intermetallic compound particles.

[11] A constituent material of the intermetallic compound particles is preferably a silicide.

[12] In this case, the constituent material of the intermetallic compound particles is preferably $MoSi_2$ or $WSi_2$.

[13] In the first aspect of the present invention, an average particle diameter of the particles preferably lies within a range of from 0.05 to 15 µm.

[14] In the first aspect of the present invention, a surface roughness Ra of a portion that is bonded to the mounting substrate is preferably from 0.05 to 10 µm.

[15] In the first aspect of the present invention, the bonding surface and the plurality of particles are preferably fixed to each other by performing a heat treatment at a temperature greater than or equal to a temperature at which a reaction occurs between the transparent sealing member and the particles.

[16] In the first aspect of the present invention, the bonding surface and the plurality of particles are preferably fixed to each other by performing a heat treatment at a temperature at which the transparent sealing member undergoes softening.

[17] An optical component according to a second aspect of the present invention includes the transparent sealing member according to the above-described first aspect of the present invention.

In accordance with the above-described characteristics, adverse effects on the resin adhesive due to the ultraviolet light emitted from the optical element can be suppressed, and it is possible to suppress a deterioration in the sealing properties with the mounting substrate.

As has been described above, in accordance with the transparent sealing member according to the present invention, adverse effects on the resin adhesive due to the ultraviolet radiation emitted from the optical element can be suppressed, and it is possible to suppress a deterioration in the sealing properties with the mounting substrate.

Further, in accordance with the optical component according to the present invention, it is possible to suppress the influence of the ultraviolet radiation on the resin adhesive that bonds the transparent sealing member and the mounting substrate to each other, and the life of the usage period thereof can be extended.

BRIEF DESCRIPTION OF DRAWINGS

FIG. 8 is a first table (Table 1) showing a breakdown of items and rejection rates of optical components according to Exemplary Embodiments 1 to 15 and a Comparative Example.

DESCRIPTION OF EMBODIMENTS

Exemplary embodiments of the transparent sealing member and the optical component according to the present invention will be described below with reference to FIGS. 1 to 8.

Figure 1:
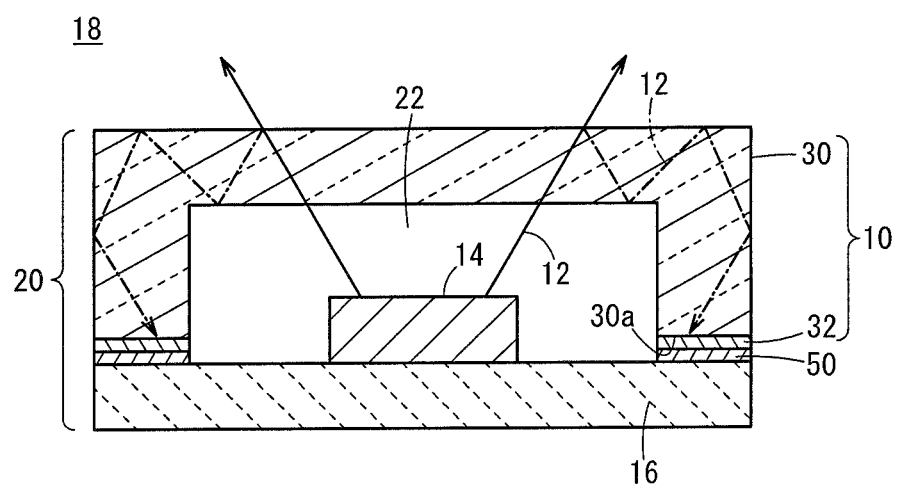
FIG. 1 is a vertical cross-sectional view showing a transparent sealing member according to a present embodiment, and an optical component including such a transparent sealing member.

As shown in FIG. 1, the transparent sealing member 10 according to the present embodiment is used with an optical component 18 having at least one optical element 14 that emits, for example, ultraviolet light 12, and a mounting substrate 16 on which the optical element 14 is mounted, and constitutes a package 20 in which the optical element 14 is accommodated, together with the mounting substrate 16. The transparent sealing member 10 is made of, for example, quartz glass, optical glass, or sapphire, and the mounting substrate 16 is made of, for example, AlN (aluminum nitride).

As discussed above, the optical element 14 is mounted on the mounting substrate 16. Although not illustrated, the optical element 14 is configured, for example, by laminating a GaN-based crystalline layer having a quantum well structure on a sapphire substrate (coefficient of thermal expansion: $7.7 \times 10^{-6}$/° C.). As a method of mounting the optical element 14, for example, a so-called face-up mounting method can be adopted in which the optical element is mounted with a light emitting surface thereof being faced toward the transparent sealing member 10. More specifically, terminals (not shown) that are led out from the optical element 14, and circuit wirings (not shown) that are formed on the mounting substrate 16, for example, are electrically connected by bonding wires (not shown).

The transparent sealing member 10 is formed in a tubular shape with a closed upper surface and an open lower surface, and includes a concave portion 22 surrounding the optical element 14 that is mounted, for example, on a flat plate-shaped mounting substrate 16. An outer shape of the transparent sealing member 10, for example, is of a cylindrical shape, a polygonal tubular shape, or the like.

Concerning the dimensions of the transparent sealing member 10, a height thereof is 0.5 to 10 mm, and an outer diameter thereof is 3.0 to 10 mm. Moreover, concerning the dimensions of the optical element 14, a thickness thereof is 0.005 to 0.5 mm, and although not shown, a vertical dimension as viewed from the upper surface is 0.5 to 2.0 mm, and a horizontal dimension is 0.5 to 2.0 mm.

In addition, the transparent sealing member 10 includes a transparent body 30 and a plurality of particles 32 that are fixed to a bonding surface 30a (also referred to as an end surface 30a) of the transparent body 30 that is bonded to the mounting substrate 16.

Figure 2A:
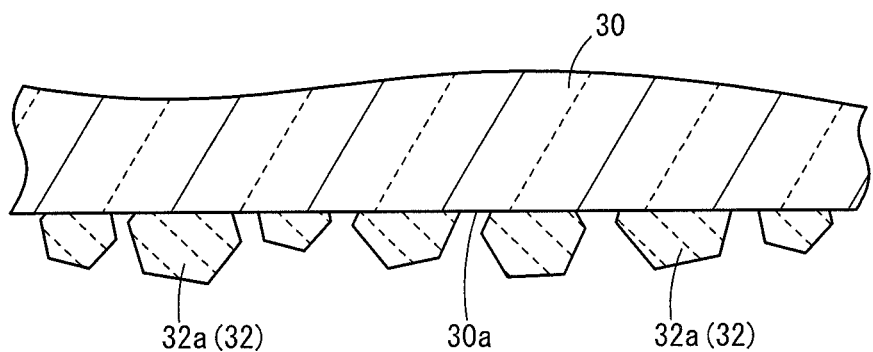
FIG. 2A is an enlarged cross-sectional view schematically showing a state in which ceramic particles are fixed to an end surface of the transparent sealing member.

Concerning the particles 32, for example as shown in FIG. 2A, ceramic particles 32a of nitride, carbide, or boride can be selected. In this case, as the constituent material of the ceramic particles 32a, there can be selected, for example, AlN (melting point 2200° C.), $Si_3N_4$ (melting point 1900° C.), SiC (melting point 2730° C.), WC (melting point 2870° C.), or $Mo_2C$ (melting point 2687° C.), BN (melting point 2730° C.), $B_4C$ (melting point 2763° C.), MoB (melting point 2823° C.) or WB (melting point 3073° C.), or the like. An average particle diameter of the ceramic particles 32a preferably lies within a range of from 0.1 to 10 μm.

A method of manufacturing the transparent sealing member 10 will be described herein with reference to FIGS. 3A to 5D.

First, the transparent body 30 is manufactured. Concerning methods of manufacturing the transparent body 30, there are (a) a process of being cut out from a bulk base material, (b) a high temperature molding process, and (c) a powder sintering method, etc.

Figure 3A:
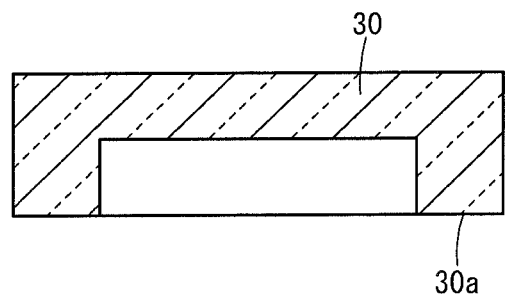
FIG. 3A is a process diagram showing a state in which a transparent body is manufactured by a cutting process or by high temperature molding.

In the cutting out process, a cutting out process from a bulk base material for the transparent body 30 is carried out, thereby producing the transparent body 30 as shown in FIG. 3A. In the high temperature molding process, a material is poured into a mold at a high temperature, or a material piece is placed in the mold and is deformed in the mold at a high temperature, thereby producing the transparent body 30 as shown in FIG. 3A.

Figure 3B:
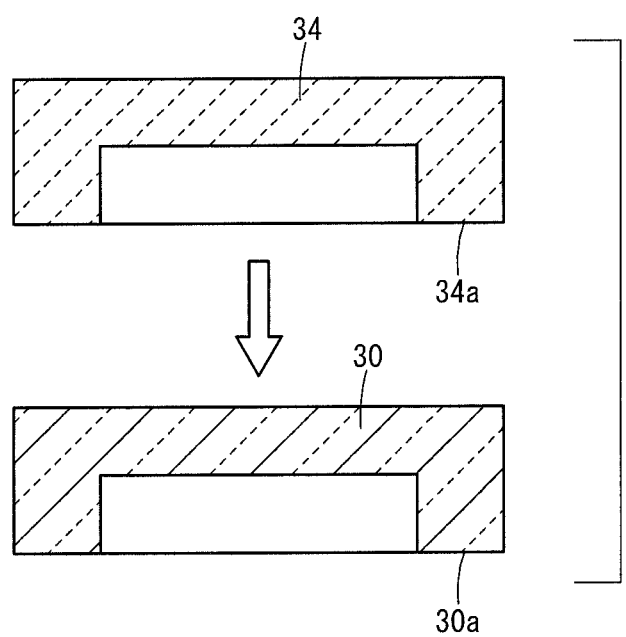
FIG. 3B is a process diagram showing a state in which the transparent body is manufactured by a powder sintering method.

In the powder sintering method, a molding slurry containing silica powder and an organic compound is cast into a molding die and solidified by a chemical reaction of the organic compounds with each other, for example, a chemical reaction between a dispersion medium and a curing agent, or between the curing agents, and thereafter, the solidified product is released from the mold, whereby as shown in FIG. 3B, a precursor 34 of the transparent body 30 is manufactured. Thereafter, the precursor 34 is subjected to a heat treatment, thereby producing the transparent body 30.

Next, the particles 32 are fixed to the end surface 30a (see FIG. 3A) of the transparent body 30. As a method of fixing the ceramic particles 32a to the end surface 30a of the transparent body 30, for example, the following two methods may be cited.

Figure 4A:
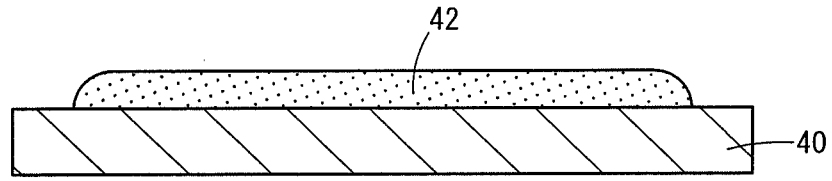
FIG. 4A is a process diagram showing a state in which a ceramic powder is arranged on a plate member.
Figure 4B:
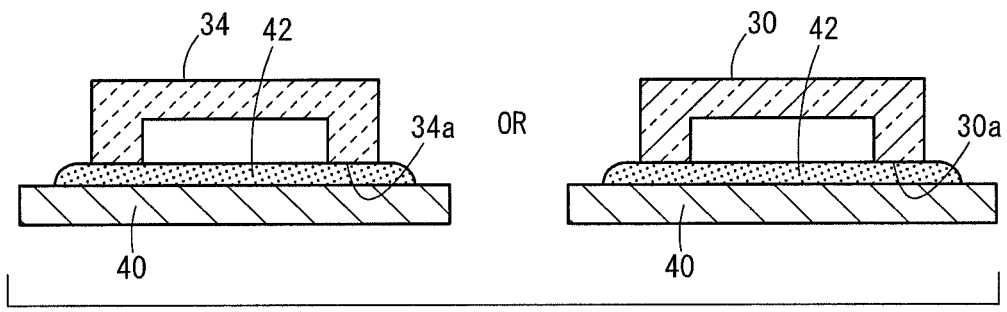
FIG. 4B is a process diagram showing a state in which the transparent body or a precursor of the transparent body is placed on the ceramic powder.
Figure 4C:
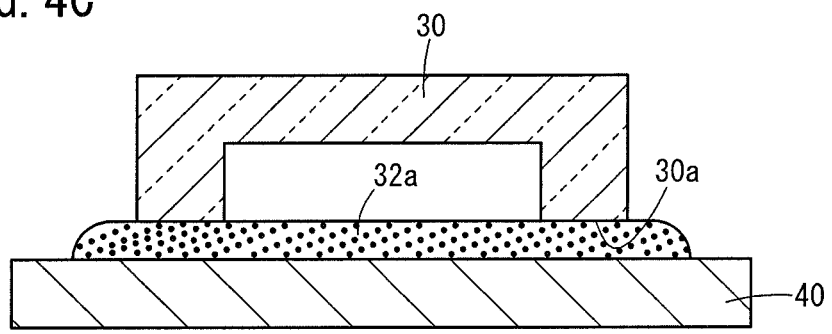
FIG. 4C is a process diagram showing a state in which a heat treatment is performed at a temperature lower than a melting point of the ceramic powder.
Figure 4D:
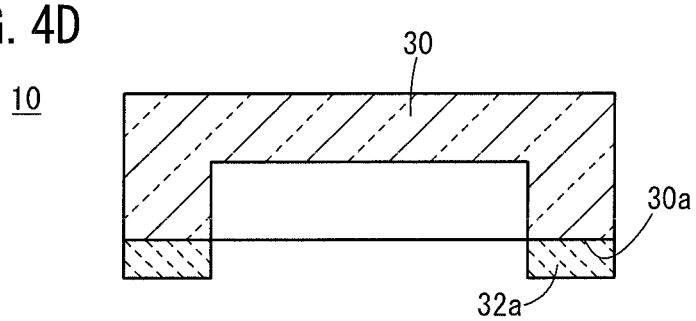
FIG. 4D is a process diagram showing a state in which the plate member is removed to thereby form the transparent sealing member to which ceramic particles are fixed.

More specifically, in the first method, as shown in FIG. 4A, a ceramic powder 42 is arranged on a plate member having a high melting point, for example, a plate member 40 made of molybdenum, and thereafter, as shown in FIG. 4B, an end surface 34a of the precursor 34 of the transparent body 30 or an end surface 30a of the transparent body 30 is oriented downward, and then the precursor or the transparent body is placed thereon (preferably in a stationary manner). Thereafter, as shown in FIG. 4C, a heat treatment is performed at a temperature lower than the melting point of the ceramic powder 42. (Preferably, at a temperature lower than the melting point of the plate member 40. The same consideration applies hereinafter.) Due to such a heat treatment, the quartz glass that makes up the transparent body 30 undergoes softening, and a portion of the ceramic powder 42 becomes embedded and fixed in the end surface 30a of the transparent body 30. Alternatively, at a contact surface between the end surface 30a of the transparent body 30 and the ceramic powder 42, the portion of the ceramic powder becomes fixed by undergoing a reaction. More specifically, a temperature of the heat treatment may be at least a temperature that is higher than a temperature at which a reaction occurs between the ceramic powder 42 and the quartz glass, or alternatively, may be a temperature that is higher than a temperature at which the quartz glass that makes up the transparent body 30 undergoes softening. In the process shown in FIG. 4B, in the case that the precursor 34 is used, the precursor 34 undergoes sintering and becomes the transparent body 30. Thereafter, as shown in FIG. 4D, by removing the plate member 40, the transparent sealing member 10 is obtained in which the ceramic particles 32a are fixed to the bonding surface 30a.

Figure 5A:
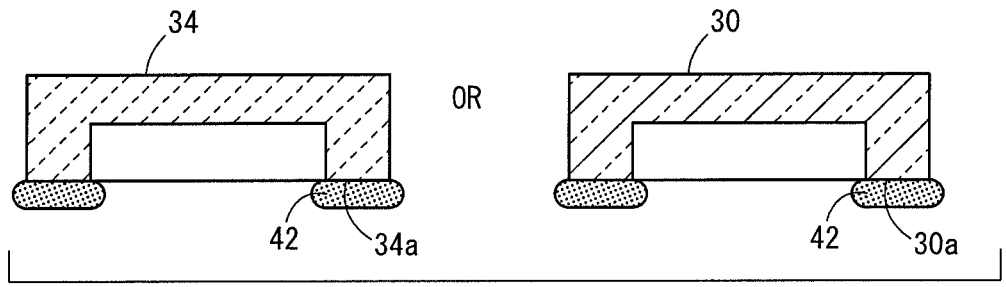
FIG. 5A is a process diagram showing a state in which a ceramic powder paste is applied to an end surface of the transparent body or to and end surface of a precursor of the transparent body.
Figure 5B:
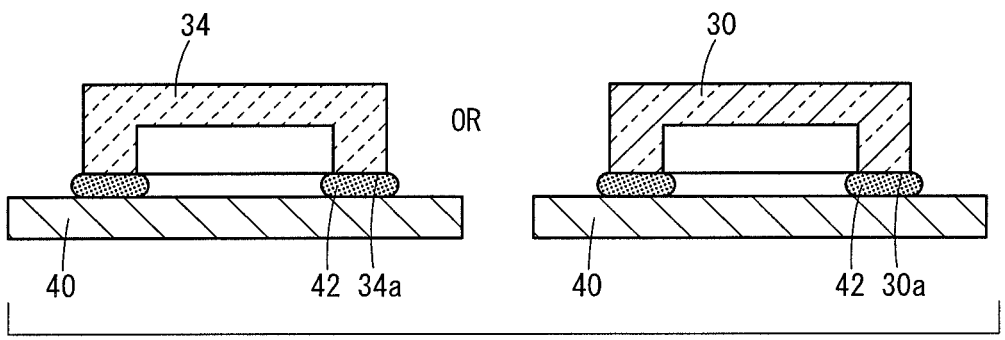
FIG. 5B is a process diagram showing a state in which the transparent body or a precursor of the transparent body is placed on a plate member.
Figure 5C:
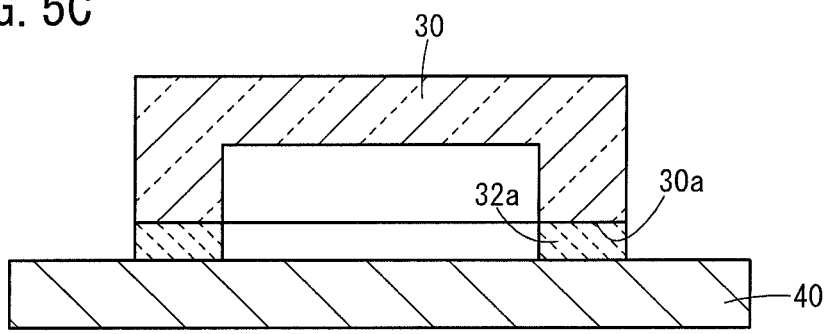
FIG. 5C is a process diagram showing a state in which a heat treatment is performed at a temperature lower than a melting point of the ceramic powder.
Figure 5D:
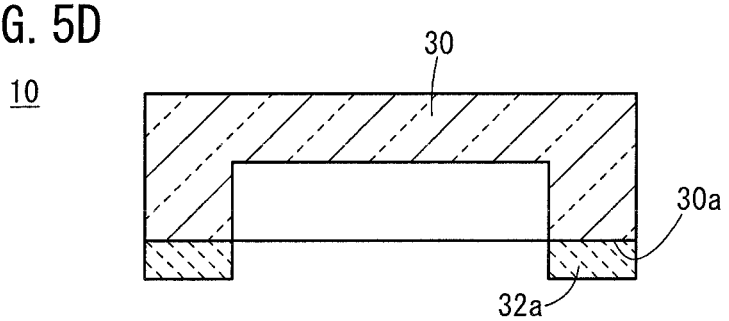
FIG. 5D is a process diagram showing a state in which the plate member is removed to thereby form the transparent sealing member to which ceramic particles are fixed.

In the second method, first, as shown in FIG. 5A, a paste-formed ceramic powder 42 is applied, by a method such as printing, dipping, spraying, or brush-coating, onto the end surface 34a of the precursor 34 of the transparent body 30 or the end surface 30a of the transparent body 30. Thereafter, as shown in FIG. 5B, after being dried, the precursor 34 of the transparent body 30 or the transparent body 30 is placed (preferably in a stationary manner) on a plate member having a high melting point, for example, the plate member 40 which is made of molybdenum. Thereafter, as shown in FIG. 5C, a heat treatment is performed at a temperature lower than the melting point of the ceramic particles 32a. In the case where the transparent body 30 is made of quartz glass, for example, the temperature may be set to be greater than or equal to 1200° C. In the process shown in FIG. 5B, in the case that the precursor 34 is used, the precursor 34 undergoes sintering and becomes the transparent body 30. Thereafter, as shown in FIG. 5D, by removing the plate member 40, the transparent sealing member 10 is obtained in which the ceramic particles 32a are fixed to the bonding surface 30a.

Figure 2B:
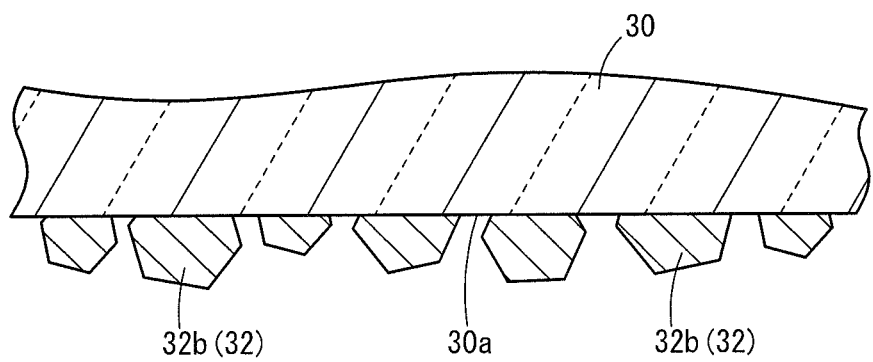
FIG. 2B is an enlarged cross-sectional view schematically showing a state in which metal particles are fixed to the end surface of the transparent sealing member.

In the above-described example, an example is shown in which the ceramic particles 32a are used as the particles 32. However, apart therefrom, as illustrated in FIG. 2B, metal particles 32b may also be used. In this case, as the constituent material of the metal particles 32b, there can be selected, for example, Mo (melting point 2623° C.), W (melting point 3422° C.), Ti (melting point 1668° C.), Zr (melting point 1855° C.), Pt (melting point 1768° C.), B (melting point 2076° C.), Cr (melting point 1907° C.), Ir (melting point 2447° C.), or the like.

Figure 2C:
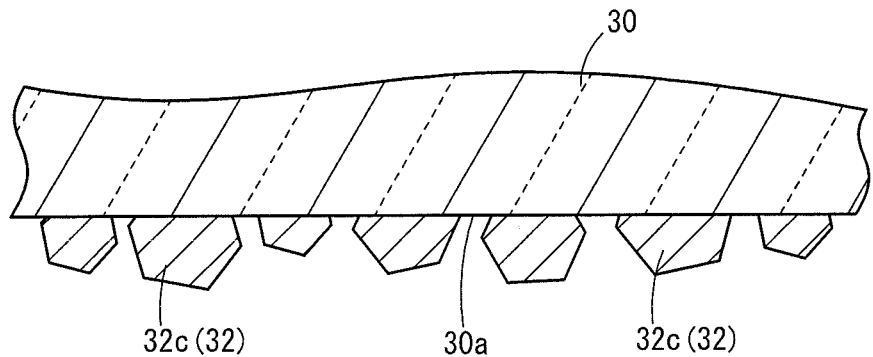
FIG. 2C is an enlarged cross-sectional view schematically showing a state in which intermetallic compound particles are fixed to the end surface of the transparent sealing member.

As shown in FIG. 2C, the particles 32 may also be intermetallic compound particles 32c. In this case, the constituent material of the intermetallic compound particles 32c is preferably a silicide, for which there can be selected, for example, $MoSi_2$ (melting point: 2030° C.), $WSi_2$ (melting point: 2160° C.), or the like.

The plurality of fixed ceramic particles 32a or the plurality of fixed metal particles 32b can be confirmed by observing with a scanning electron microscope (3000 times magnification) the portion of the transparent sealing member 10 that is bonded to the mounting substrate 16. Since the ceramic particles 32a or the metal particles 32b protrude toward a later-described resin adhesive 50, due to a so-called anchor effect, the bonding strength with the resin adhesive 50 can be improved.

The particle diameter of the ceramic particles 32a or the metal particles 32b that are fixed to the portion of the transparent sealing member 10 that is joined to the mounting substrate 16 is 0.05 to 15 μm, more preferably, is 0.1 to 10 μm, and even more preferably, is 1 to 5 μm. Further, a condition is preferred in which the surface roughness Ra of the surface with the ceramic particles 32a or the metal particles 32b fixed thereto is 0.05 to 10 μm, more preferably, is 0.1 to 5 μm, and even more preferably, is 0.5 to 3 μm. In this instance, the surface roughness of the portion that is bonded to the mounting substrate 16 is not the surface roughness of the bonding surface 30a itself, but is indicative of a surface roughness after the ceramic particles 32a, the metal particles 32b, or the intermetallic compound particles 32c have been fixed to the bonding surface 30a.

Even in the case that the ceramic particles 32a or the metal particles 32b are fixed, if the particle diameter thereof is smaller than 0.05 μm, the anchor effect becomes reduced, and the effect of enhancing the bonding strength with the resin adhesive 50 becomes reduced. Further, if the particle diameter is greater than or equal to 15 μm, the ceramic particles 32a or the metal particles 32b become easily detached from the transparent sealing member 10. Further, in the case that the surface roughness Ra is less than 0.05 μm, the anchor effect becomes reduced, and in the case that the surface roughness Ra is greater than 10 μm, cases may occur in which it becomes impossible to undergo bonding with the mounting substrate 16.

Additionally, as noted previously, the transparent sealing member 10 having the ceramic particles 32a, the metal particles 32b, or the intermetallic compound particles 32c that are fixed to the bonding surface 30a is bonded onto the mounting substrate 16 through the resin adhesive 50. A silicone resin-based adhesive, an epoxy resin-based adhesive, or a fluororesin-based adhesive can be used as the resin adhesive 50.

In the foregoing manner, due to the fact that the transparent sealing member 10 includes the plurality of particles 32 (the ceramic particles 32a, the metal particles 32b, or the intermetallic compound particles 32c) that are fixed to the bonding surface 30a that is bonded to the mounting substrate 16, the following operations and effects are realized.

More specifically, as shown in FIG. 1, the ultraviolet light 12 that is emitted from the optical element 14 is transmitted through the transparent sealing member 10 and is emitted to the exterior. However, a portion of the ultraviolet light 12 is guided inside the transparent sealing member 10 and travels toward the joined portion of the transparent sealing member 10. Conventionally, the ultraviolet light 12 that is guided through the transparent sealing member 10 impinges upon the resin adhesive 50, and as a result, the resin adhesive 50 may become deteriorated, as well as lead to a deterioration in the durability of the package 20 (deterioration of the optical component).

In contrast thereto, the transparent sealing member 10 according to the present embodiment includes the plurality of particles 32 (the ceramic particles 32a, the metal particles 32b, or the intermetallic compound particles 32c) that are fixed to the bonding surface 30a that is bonded with the mounting substrate 16. Therefore, due to the fact that the ultraviolet light 12 that has been guided inside the transparent sealing member 10 is attenuated, refracted, and reflected by the particles 32, the ultraviolet light 12 is not directly incident on the resin adhesive 50.

More specifically, in the optical component 18 according to the present embodiment, it is possible to suppress the influence of the ultraviolet light 12 on the resin adhesive 50 that bonds the transparent sealing member 10 and the mounting substrate 16 to each other, and the life of the usage period thereof can be extended.

Further, in the transparent sealing member 10 according to the present embodiment, adverse effects on the resin adhesive 50 due to the ultraviolet light 12 emitted from the optical element 14 can be suppressed, and it is possible to suppress a deterioration in the sealing properties with the mounting substrate 16.

Figure 6A:
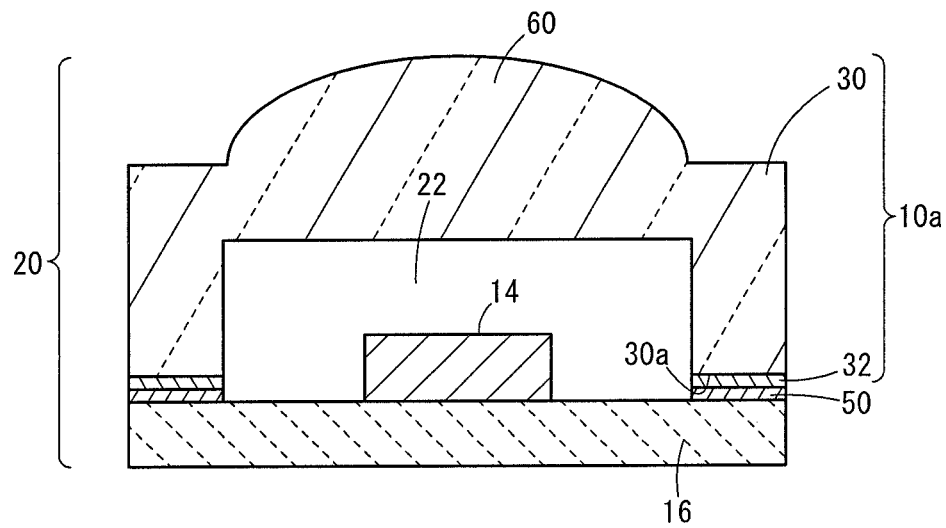
FIG. 6A is a vertical cross-sectional view showing a transparent sealing member according to a first modification, and an optical component including such a transparent sealing member.
Figure 6B:
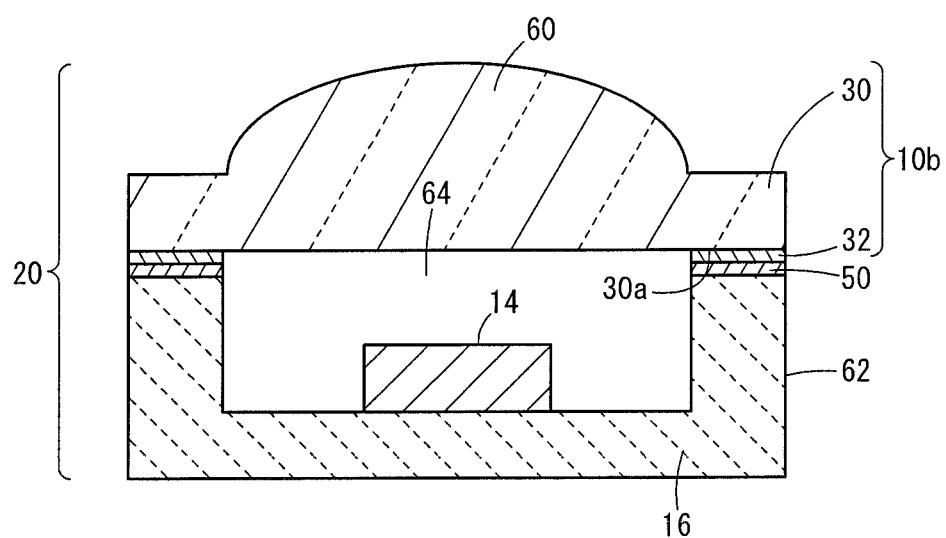
FIG. 6B is a vertical cross-sectional view showing a transparent sealing member according to a second modification, and an optical component including such a transparent sealing member.
Figure 7:
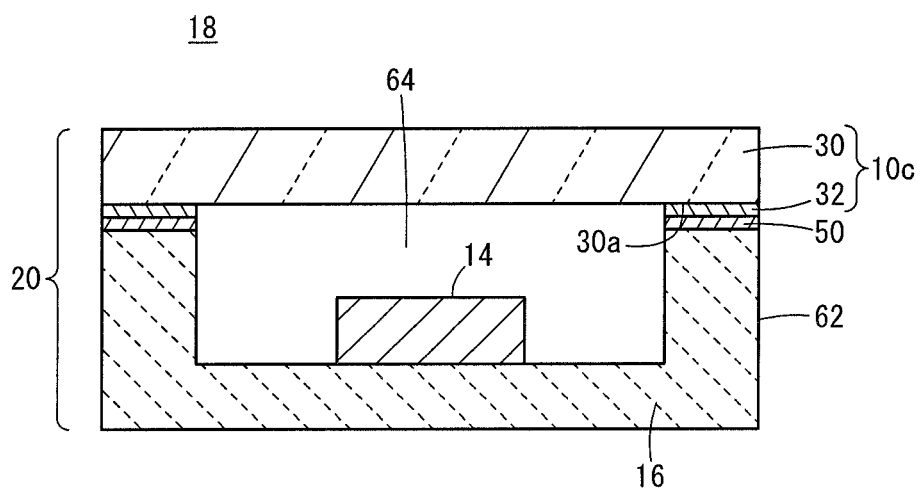
FIG. 7 is a vertical cross-sectional view showing a transparent sealing member according to a third modification, and an optical component including such a transparent sealing member.

As modifications of the transparent sealing member 10, there may be cited, for example, the configurations shown in FIGS. 6A to 7.

More specifically, a transparent sealing member 10a according to a first modification shown in FIG. 6A has a configuration similar to that of the transparent sealing member 10 described above, but differs therefrom in that a lens body 60 is integrally included on the transparent body 30.

A transparent sealing member 10b according to a second modification shown in FIG. 6B has a similar configuration to that of the transparent sealing member 10 described above, but differs therefrom in the following points. Namely, a lower surface of the transparent body 30 is flat. Moreover, the mounting substrate 16 includes a concave portion 64 in which upwardly rising side walls 62 (peripheral walls) are formed integrally on a peripheral portion thereof, and has the optical element 14 mounted thereon.

A transparent sealing member 10c according to a third modification shown in FIG. 7 has a similar configuration to that of the transparent sealing member 10b according to the second modification, but differs therefrom in that the shape thereof is plate-shaped.

In such transparent sealing members 10a, 10b, and 10c as well, the plurality of particles 32 that are fixed to the bonding surface 30a that is bonded with the mounting substrate 16 are included, and therefore, the ultraviolet light 12 that has been guided inside the transparent sealing members 10a, 10b, and 10c is attenuated and reflected by the particles 32, and the ultraviolet light 12 is not directly incident on the resin adhesive 50. In accordance with this feature, in the optical component 18, it is possible to suppress the influence of the ultraviolet light 12 on the resin adhesive 50 that bonds the transparent sealing members 10a, 10b, and 10c and the mounting substrate 16 to each other, and the life of the usage period thereof can be extended.

EXEMPLARY EMBODIMENTS

In relation to Exemplary Embodiments 1 to 15 and a Comparative Example, the sealing properties of the transparent sealing member 10 with respect to the mounting substrate 16 were evaluated.

Exemplary Embodiment 1

The optical component according to the first exemplary embodiment (Exemplary Embodiment 1) is of the same configuration as the optical component 18 shown in FIG. 1.

(Manufacturing of the Transparent Sealing Member)

The method of manufacturing the transparent sealing member 10 according to Exemplary Embodiment 1 is as described below. More specifically, the transparent body 30 was obtained by a process of being cut out from a bulk base material made of quartz glass. The transparent body 30 has an outer shape of 3.5 mm square and a height of 1 mm.

Thereafter, the ceramic particles 32a were fixed to the end surface 30a (bonding surface 30a) of the transparent body 30. In the fixing method, first, ceramic particles 32a (SiC particles) having an average particle diameter of 0.1 μm were spread to a thickness on the order of 1 mm on a plate made of molybdenum, and the transparent body 30 was placed on the molybdenum plate with the end surface 30a thereof oriented downward. Thereafter, a heat treatment was performed at a temperature lower than the melting point of the ceramic particles 32a and greater than or equal to 1200° C., thereby fixing the ceramic particles 32a to the end surface 30a of the transparent body 30 and obtaining the transparent sealing member 10 according to Exemplary Embodiment 1. Moreover, the average particle diameter of the ceramic particles 32a was measured using a laser diffraction/scattering particle size distribution measurement apparatus LA-750 manufactured by Horiba.

In the transparent sealing member 10, the surface roughness Ra of the portion bonded to the mounting substrate 16 was 0.1 μm.

Thereafter, the mounting substrate 16 on which the ultraviolet light emitting element was mounted and the transparent sealing member 10 were joined to each other with an epoxy resin adhesive, thereby manufacturing the optical component 18 according to Exemplary Embodiment 1.

Exemplary Embodiments 2 to 4

In Exemplary Embodiments 2, 3, and 4, the optical components 18 according to Exemplary Embodiments 2, 3, and 4 were manufactured in the same manner as in Exemplary Embodiment 1, except for the point that ceramic particles (SiC particles) 32a having an average particle diameter of 1.0 μm, 5.0 μm, and 10.0 μm were used as the ceramic particles 32a that were fixed to the bonding surface 30a of the transparent sealing member 10. Moreover, in the transparent sealing members 10 according to Exemplary Embodiments 2, 3, and 4, the surface roughnesses Ra of the portions bonded to the mounting substrate 16 were 0.5 μm, 2.5 μm, and 5.0 μm.

Exemplary Embodiment 5

In Exemplary Embodiment 5, the optical component 18 according to Exemplary Embodiment 5 was manufactured in the same manner as in Exemplary Embodiment 1, except for the point that metal particles (molybdenum particles) 32b having an average particle diameter of 0.1 μm were fixed to the bonding surface 30a of the transparent sealing member 10. In the transparent sealing member 10, the surface roughness Ra of the portion bonded to the mounting substrate 16 was 0.1 μm.

Exemplary Embodiments 6 to 8

In Exemplary Embodiments 6, 7, and 8, the optical components 18 according to Exemplary Embodiments 6, 7, and 8 were manufactured in the same manner as in Exemplary Embodiment 5, except for the point that metal particles (molybdenum particles) 32b having an average particle diameter of 1.0 μm, 5.0 μm, and 10.0 μm were used as the metal particles 32b that were fixed to the bonding surface 30a of the transparent sealing member 10. In the transparent sealing members 10 according to Exemplary Embodiments 6, 7, and 8, the surface roughnesses Ra of the portions bonded to the mounting substrate 16 were 0.5 μm, 2.5 μm, and 5.0 μm.

Exemplary Embodiment 9

In Exemplary Embodiment 9, the optical component 18 according to Exemplary Embodiment 9 was manufactured in the same manner as in Exemplary Embodiment 1, except for the point that intermetallic compound particles ($MoSi_2$ particles) 32c having an average particle diameter of 0.1 μm were fixed to the bonding surface 30a of the transparent sealing member 10. In the transparent sealing member 10, the surface roughness Ra of the portion bonded to the mounting substrate 16 was 0.1 μm.

Exemplary Embodiments 10 to 12

In Exemplary Embodiments 10, 11, and 12, the optical components 18 according to Exemplary Embodiments 10, 11, and 12 were manufactured in the same manner as in Exemplary Embodiment 9, except for the point that intermetallic compound particles ($MoSi_2$ particles) 32c having an average particle diameter of 1.0 μm, 5.0 μm, and 10.0 μm were used as the intermetallic compound particles 32c that were fixed to the bonding surface 30a of the transparent sealing member 10. Moreover, in the transparent sealing members 10 according to Exemplary Embodiments 10, 11, and 12, the surface roughnesses Ra of the portions bonded to the mounting substrate 16 were 0.5 μm, 2.5 μm, and 5.0 μm.

Exemplary Embodiment 13

In Exemplary Embodiment 13, the transparent body 30 was manufactured by the aforementioned powder sintering method. More specifically, a slurry containing silica powder and an organic compound was prepared. The slurry was poured into a mold at room temperature, and left at room was released from the mold. Furthermore, the molded body was allowed to dry for a certain period of time in order to obtain a silica powder molded body. Moreover, the average particle diameter of the raw material powder was measured using a laser diffraction/scattering particle size distribution measurement apparatus LA-750 manufactured by Horiba.

Ceramic particles 32a (SiC particles) having an average particle diameter of 0.1 μm were spread to a thickness on the order of 1 mm on a plate made of molybdenum, and the silica powder molded body was placed on the molybdenum plate with the end surface thereof oriented downward. Thereafter, after the silica powder molded body was subjected to a degreasing process together with the ceramic particles 32a at 400 to 1200° C. in an air atmosphere, a heat treatment was performed at 1500 to 1700° C. in an inert atmosphere, and the molded body was increased in density and made transparent to thereby manufacture the transparent body 30. Along therewith, the ceramic particles 32a were fixed to the end surface 30a (bonding surface 30a) of the transparent body 30. The transparent sealing member 10 has an outer shape of 3.5 mm square and a height of 1 mm. Further, in the same manner as in Exemplary Embodiment 1, the surface roughness Ra of the portion bonded to the mounting substrate 16 was 0.1 μm.

Exemplary Embodiments 14 and 15

In Exemplary Embodiments 14 and 15, the optical components 18 according to Exemplary Embodiments 14 and 15 were manufactured in the same manner as in Exemplary Embodiment 1, except for the point that SiC particles having an average particle diameter of 0.05 μm and 15.0 μm were used as the ceramic particles 32a that were fixed to the bonding surface 30a of the transparent sealing member 10. Moreover, in the transparent sealing members 10 according to Exemplary Embodiments 14 and 15, the surface roughnesses Ra of the portions bonded to the mounting substrate 16 were 0.05 μm and 9.0 μm.

Comparative Example

In a Comparative Example, without the particles 32 being fixed to the bonding surface 30a of the transparent sealing member 10, the mounting substrate 16 on which the ultraviolet light emitting element was mounted and the transparent sealing member 10 were directly joined to each other with an epoxy resin adhesive, thereby manufacturing the optical component according to the Comparative Example. Moreover, in the transparent sealing member 10 according to the Comparative Example, the surface roughness Ra of the portion bonded to the mounting substrate 16 was 0.02 μm.

[Evaluation Method]

Concerning the respective types of optical components that were manufactured in the manner described above, an initial luminous flux after the transparent sealing member 10 and the mounting substrate 16 on which the ultraviolet light emitting element was mounted were joined to each other through the resin adhesive 50 was measured. Next, the optical components 18 were inserted into a constant-temperature constant-humidity chamber, and under a relative humidity condition of 80%, a heat-up/heat-down cycle was performed 100 times with temperatures of 10° C.→80° C.→10° C. being treated as one cycle. After the heat cycles, optical components 18 in which a luminous flux of greater than or equal to 80% was maintained were considered as successful (passing), whereas optical components 18 in which the luminous flux decreased to less than 80% were considered unsuccessful (rejected). Then, the rejection rate of each of the optical components 18 was calculated.

In Table 1 of FIG. 8, a breakdown of items and rejection rates of the optical components according to Exemplary Embodiments 1 to 15 and a Comparative Example are shown.

As can be appreciated from Table 1 of FIG. 8, all of the Exemplary Embodiments 1 to 15 were regarded as favorable with a rejection rate of less than or equal to 25%. In particular, in Exemplary Embodiments 1 to 13, the rejection rate was less than or equal to 5%, which was even more favorable than in the Exemplary Embodiments 14 and 15. On the other hand, in the Comparative Example, the rejection rate was 35%, which was worse than in the Exemplary Embodiments 14 and 15. This is considered to be due to the fact that, since the transparent sealing member 10 is directly bonded with respect to the mounting substrate 16 through the resin adhesive 50, the ultraviolet light 12 from the optical element 14 was guided in the transparent sealing member 10, and was incident on the resin adhesive 50, whereby the resin adhesive 50 became deteriorated.

Accordingly, it is preferable for the transparent sealing member 10 to include the plurality of particles 32 (the ceramic particles 32a, the metal particles 32b, or the intermetallic compound particles 32c) that are fixed to the bonding surface 30a that is bonded to the mounting substrate 16. In this case, the average particle diameter of the particles 32 that are fixed to the bonding surface 30a of the transparent sealing member 10 preferably lies within a range of from 0.1 to 10 μm, and more preferably, lies within a range of from 1.0 to 5.0 μm. Further, in the transparent sealing member 10, the surface roughness Ra of the portion bonded to the mounting substrate 16 is preferably 0.1 to 5 μm, and more preferably, is 0.5 to 2.5 μm.

The transparent sealing member and the optical component according to the present invention are not limited to the above-described embodiments, and it is a matter of course that various configurations can be adopted therein without departing from the essence and gist of the present invention.

The invention claimed is:

1. A transparent sealing member adapted to be used in a package in which at least one optical element is accommodated, the transparent sealing member being bonded, by a resin adhesive, onto a mounting substrate on which the optical element is mounted;
    wherein the transparent sealing member includes a transparent body through which an ultraviolet light is transmitted, a bond surface which is formed by an end face of the transparent body and is bonded to the mounting substrate, and a plurality of particles configured to attenuate the ultraviolet light and fixed to the bonding surface that is bonded to the mounting substrate,
    the plurality of particles are partially embedded in the transparent body and fixed to the bonding surface, or alternatively, are fixed to the bonding surface via a reaction layer at a contact surface between the plurality of particles and the end face of the transparent body, and
    the plurality of particles protrude from the bonding surface.

2. The transparent sealing member according to claim 1, wherein the transparent sealing member is used in an optical component having the optical element and the mounting substrate, and together with the mounting substrate, constitutes the package, which accommodates the optical element.

3. The transparent sealing member according to claim 1, wherein the transparent sealing member is made of quartz glass, optical glass, or sapphire.

4. The transparent sealing member according to claim 1, wherein a melting point of the particles is higher than a melting point of the transparent sealing member.

5. The transparent sealing member according to claim 1, wherein the particles are ceramic particles of nitride, carbide, or boride.

6. The transparent sealing member according to claim 5, wherein a constituent material of the ceramic particles is AlN (aluminum nitride), $Si_3N_4$ (silicon nitride), SiC (silicon carbide), WC (tungsten carbide), $Mo_2C$ (molybdenum carbide), BN (boron nitride), $B_4C$ (boron carbide), MoB (molybdenum boride), or WB (tungsten boride).

7. The transparent sealing member according to claim 1, wherein the particles are metal particles.

8. The transparent sealing member according to claim 7, wherein a constituent material of the metal particles is Mo (molybdenum), W (tungsten), Ti (titanium), Zr (zirconium), Pt (platinum), B (boron), Cr (chromium), or Ir (iridium).

9. The transparent sealing member according to claim 1, wherein the particles are intermetallic compound particles.

10. The transparent sealing member according to claim 9, wherein a constituent material of the intermetallic compound particles is a silicide.

11. The transparent sealing member according to claim 10, wherein the constituent material of the intermetallic compound particles is $MoSi_2$ or $WSi_2$.

12. The transparent sealing member according to claim 1, wherein an average particle diameter of the particles lies within a range of from 0.05 to 15 μm.

13. The transparent sealing member according to claim 1, wherein a surface roughness Ra of a portion that is bonded to the mounting substrate is from 0.05 to 10 μm.

14. The transparent sealing member according to claim 1, wherein the bonding surface and the plurality of particles are fixed to each other by performing a heat treatment at a temperature greater than or equal to a temperature at which a reaction occurs between the transparent sealing member and the particles.

15. The transparent sealing member according to claim 1, wherein the bonding surface and the plurality of particles are fixed to each other by performing a heat treatment at a temperature at which the transparent sealing member undergoes softening.

16. An optical component comprising a transparent sealing member, wherein:

the transparent sealing member is adapted to be used in a package in which at least one optical element is accommodated, the transparent sealing member being bonded, by a resin adhesive, onto a mounting substrate on which the optical element is mounted; and the transparent sealing member includes a transparent body through which an ultraviolet light is transmitted, a bonding surface which is formed by an end face of the transparent body and is bonded to the mounting substrate, and a plurality of particles configured to attenuate the ultraviolent light and fixed to the bonding surface that is bonded to the mounting substrate, the plurality of particles are partially embedded in the transparent body and fixed to the bonding surface, or alternatively, are fixed to the bonding surface via a reaction layer at a contact surface between the plurality of particles and the end face of the transparent body, and the plurality of particles protrude from the bonding surface.

\* \* \* \* \*